(12) United States Patent
Sutardja et al.

(10) Patent No.: US 9,041,467 B2
(45) Date of Patent: *May 26, 2015

(54) POWER AMPLIFIER WITH FEEDBACK IMPEDANCE FOR STABLE OUTPUT

(71) Applicant: Marvell World Trade Ltd., St. Michael (BB)

(72) Inventors: Sehat Sutardja, Los Altos Hills, CA (US); Kan Li, Singapore (SG); Poh Boon Leong, Singapore (SG)

(73) Assignee: Marvell World Trade Ltd., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 13/946,912

(22) Filed: Jul. 19, 2013

(65) Prior Publication Data

US 2013/0300507 A1    Nov. 14, 2013

Related U.S. Application Data

(63) Continuation-in-part of application No. 12/983,731, filed on Jan. 3, 2011, now Pat. No. 8,508,294.

(60) Provisional application No. 61/767,125, filed on Feb. 20, 2013, provisional application No. 61/292,124, filed on Jan. 4, 2010.

(51) Int. Cl.
*H03F 3/21* (2006.01)
*H03F 1/08* (2006.01)
*H03F 1/34* (2006.01)
*H03F 1/56* (2006.01)
*H03F 3/191* (2006.01)

(52) U.S. Cl.
CPC .................. *H03F 3/21* (2013.01); *H03F 1/083* (2013.01); *H03F 1/34* (2013.01); *H03F 1/56* (2013.01); *H03F 3/191* (2013.01)

(58) Field of Classification Search
USPC ............................ 330/107, 109, 294, 86, 282
See application file for complete search history.

(56) References Cited

U.S. PATENT DOCUMENTS

| 4,417,216 | A | 11/1983 | Davis |
| 6,859,097 | B2 * | 2/2005 | Chandler ...................... 330/107 |
| 8,508,294 | B2 | 8/2013 | Li et al. |
| 2009/0096533 | A1 | 4/2009 | Paul |
| 2011/0163804 | A1 | 7/2011 | Li |

FOREIGN PATENT DOCUMENTS

| GB | 2200007 | 7/1988 |
| WO | WO 0189081 | 11/2001 |
| WO | WO 02/21682 | 3/2002 |

OTHER PUBLICATIONS

Kawada, "A 500-MHz and 60-dBΩ CMOS transimpedance amplifier using the new feedforward stabilization technique," IEICE Trans, Electronic, E88-C:1285-1287 (2005).
PCT International Search Report, Application No. PCT/IB2011/000171, Jun. 29, 2011.

* cited by examiner

*Primary Examiner* — Hieu Nguyen

(57) ABSTRACT

An amplifier circuit amplifies a signal for wireless transmission. A feedback circuit, including a capacitor, is coupled to the amplifier circuit. Components of the feedback circuit are selected based on a feedback factor such that an input impedance to the amplifier circuit has a same impedance characteristic as a feedback circuit impedance of the feedback circuit.

22 Claims, 8 Drawing Sheets

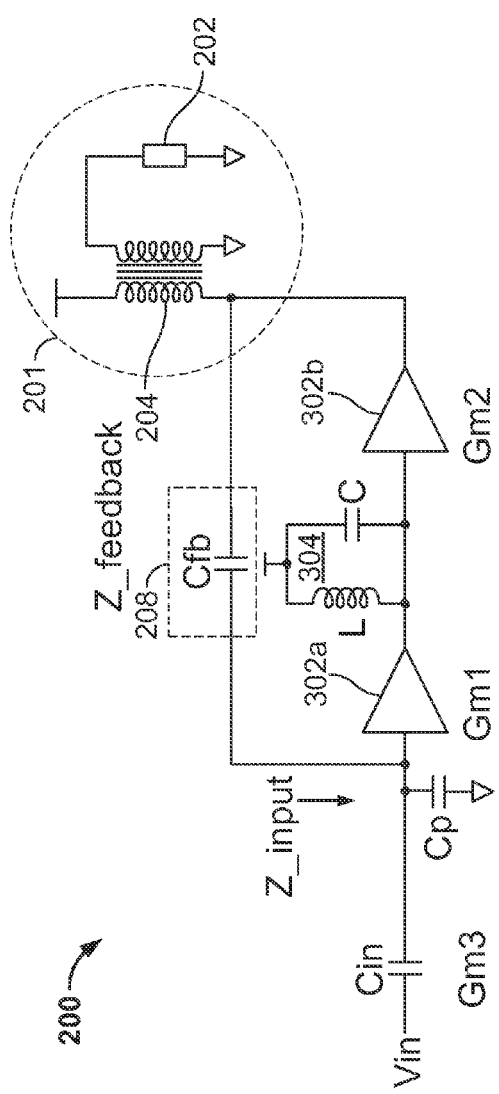
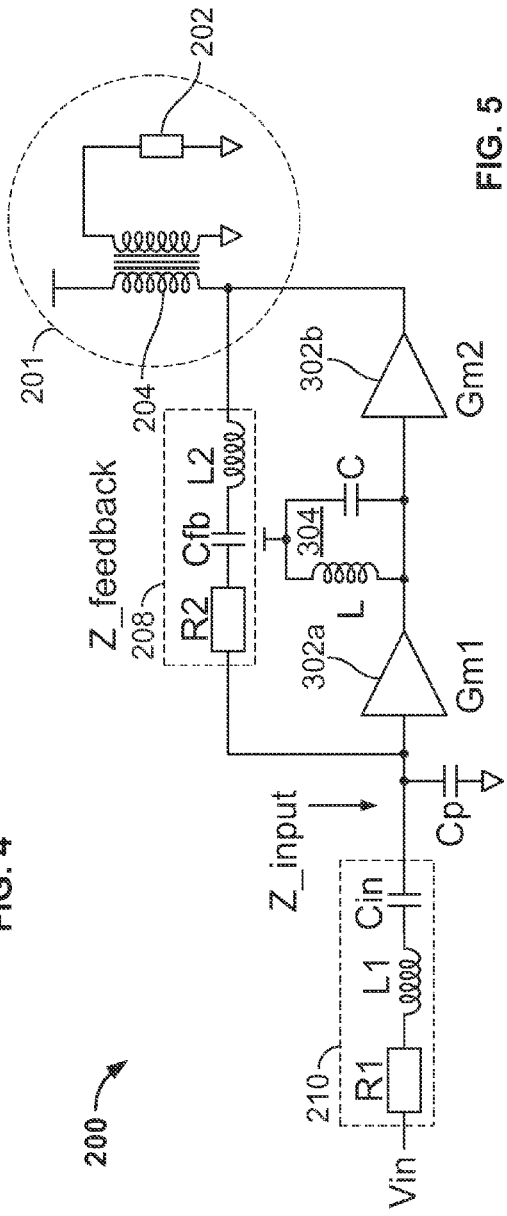
FIG. 4
FIG. 5

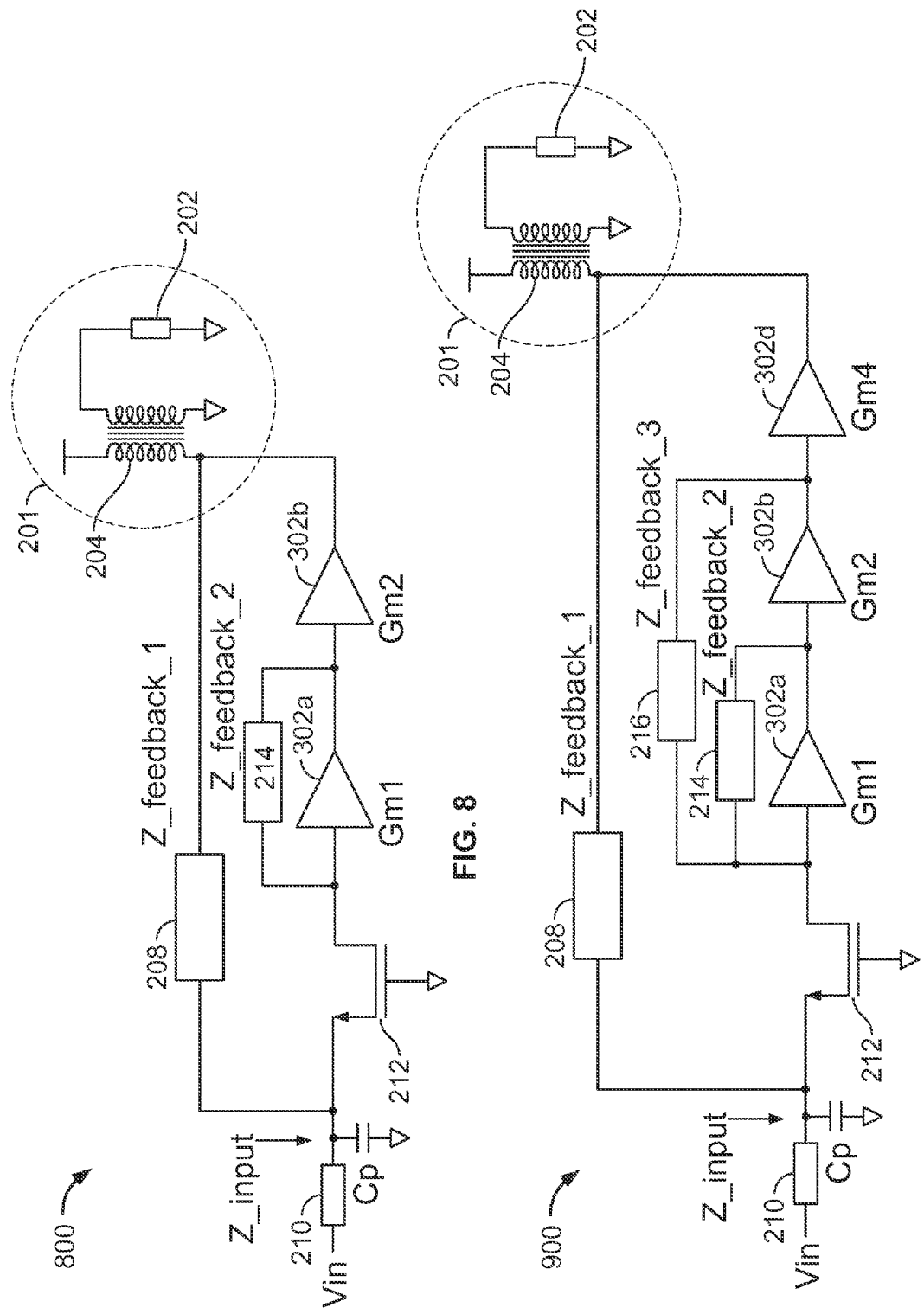

POWER AMPLIFIER WITH FEEDBACK IMPEDANCE FOR STABLE OUTPUT

CROSS REFERENCE TO RELATED APPLICATIONS

This application is a continuation-in-part of co-pending U.S. patent application Ser. No. 12/983,731, filed Jan. 3, 2011, which claims the benefit of U.S. Provisional Application No. 61/292,124, filed Jan. 4, 2010. This application also claims the benefit of U.S. Provisional Patent Application No. 61/767,125, filed Feb. 20, 2013. Each of the above-identified applications is hereby incorporated by reference in its entirety.

BACKGROUND

The present disclosure relates generally to power amplification systems and methods, and, more particularly, to systems and methods for power amplification with feedback impedance for stable output.

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted as prior art against the present disclosure. The present disclosure relates generally to power amplification, and, more particularly, to power amplification with feedback impedance for stable output in wireless communication systems.

FIG. 1 depicts an example of a power amplifier (PA) 100. Power amplifier (PA) 100 is coupled to a wideband transformer 101 that includes a transformer 102 and a load 104. Power amplifier 100 may be part of a wireless transmitter. In one example, a signal from power amplifier 100 is coupled through transformer 102 and transmitted through an antenna.

Power amplifier 100 includes a first amplifier 108a, an inductor-capacitor (LC) resonant tank 110, a second amplifier 108b, and a resistor R1 in a feedback loop. Power amplifier 100 may become unstable. An input circuit 106 provides an input signal to power amplifier 100.

A dominant pole is introduced by amplifier 108a and LC resonant tank 110. This introduces a phase shift of around 90° (at a unity gain point) at the signal output by power amplifier 100. Also, a phase shift introduced by amplifier 108b and transformer 102 may be less, such as 30°. To have a stable power amplifier, a total phase shift for power amplifier 100 should be less than 180°. Thus, a phase shift introduced by the feedback loop should be less than 60°.

The input impedance is shown as impedance Z_input and in this case, is a parasitic capacitance of a transistor in amplifier 108a. The parasitic capacitance is modeled as a parasitic capacitor Cp. Because the feedback impedance Z_feedback is a resistance, the resistor-capacitor combination may introduce a phase shift that is greater than 60°. This may cause power amplifier 100 to be unstable and the signal may oscillate. Also, the resistor-capacitor combination may create a pole that is within the working bandwidth of the wireless transmitter. This may alter the gain characteristics for power amplifier 100.

SUMMARY

In certain embodiments, an apparatus includes an amplifier circuit. A first feedback circuit may be coupled to the amplifier circuit. The first feedback circuit may include a capacitor. Components of the first feedback circuit may be selected based on a feedback factor. An input impedance to the amplifier circuit may have a same impedance characteristic as a feedback circuit impedance of the first feedback circuit.

In certain implementations, the apparatus may include a second feedback circuit connected to the amplifier circuit. In certain implementations, the second feedback circuit may include a capacitor. In certain implementations, components of the second feedback circuit may be selected based on the feedback factor. In certain implementations, an input impedance to the amplifier circuit may have a same impedance characteristic as a feedback circuit impedance of the second feedback circuit In certain implementations, the apparatus may include a first feedforward circuit connected to the amplifier. In certain implementations, the first feedforward circuit may comprise a capacitor. In certain implementations, components of the first feedforward circuit may be selected based on a feedforward factor. In certain implementations, an input impedance to the amplifier circuit may have a same impedance characteristic as a feedforward circuit impedance of the first feedforward circuit.

In certain embodiments, an amplifier circuit system may include a first amplifier stage configured to amplify a signal. The system may include a circuit configured to receive the signal from the first amplifier stage. The system may include a second amplifier stage configured to amplify the signal from the circuit. The system may include a feedback circuit coupled to the second amplifier stage. The feedback circuit may comprise a capacitor. Components of the feedback circuit may be selected based on a feedback factor. An input impedance to the first amplifier stage may have a same impedance characteristic as a feedback circuit impedance of the feedback circuit. The system may include a transformer configured to receive the signal from the second amplifier stage.

In certain implementations, the system may include a feedforward circuit coupled to the amplifier circuit. In certain implementations, components of the feedforward circuit may be selected based on a feedforward factor. In certain implementations, an input impedance to the amplifier circuit may have a same impedance characteristic as a feedforward circuit impedance of the feedforward circuit. In certain implementations, the feedforward circuit may include a capacitor.

The following detailed description and accompanying drawings provide a more detailed understanding of the nature and advantages of the present invention.

BRIEF DESCRIPTION OF THE DRAWINGS

FIG. 4 shows an example of a power amplifier using a voltage input driver according to one embodiment.

FIG. 5 shows an example of a power amplifier using an inductor-capacitor-resistor circuit arranged in series according to one embodiment.

FIG. 8 shows an example of a power amplifier using multiple feedback circuits according to one embodiment.

FIG. 9 shows an additional example of a power amplifier using multiple feedback circuits according to one embodiment.

DETAILED DESCRIPTION

Described herein are techniques for a power amplifier. In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

Figure 1:
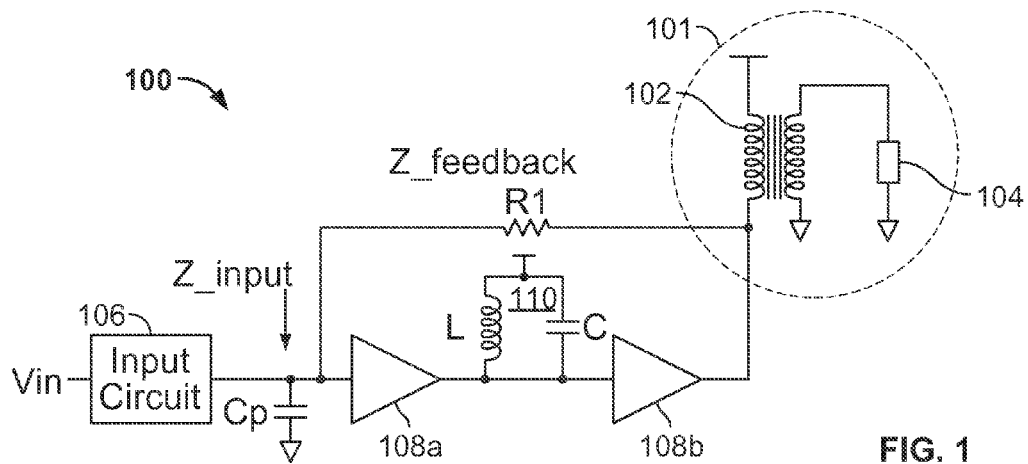
FIG. 1 shows an example of a power amplifier (PA).
Figure 2A:
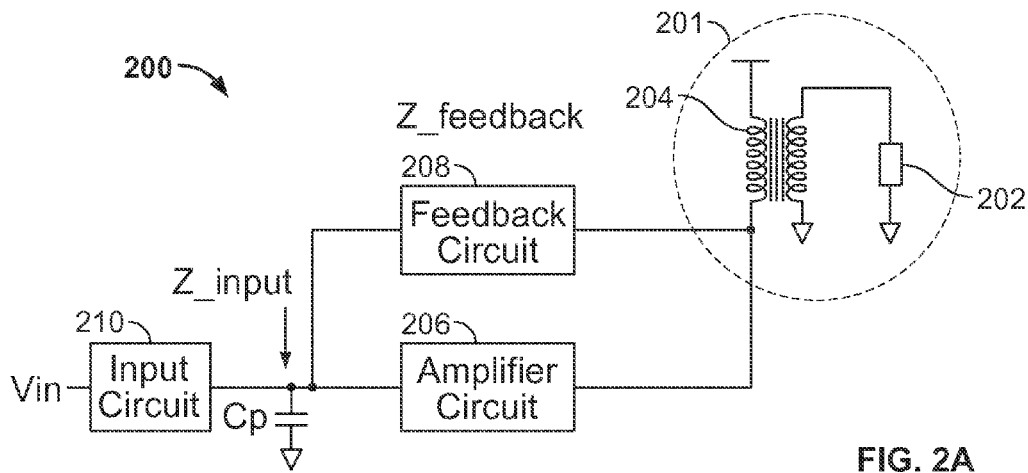
FIG. 2A shows an example of a power amplifier according to one embodiment.

FIG. 2A depicts an example of a power amplifier (PA) 200 according to one embodiment. Power amplifier 200 drives an antenna (not shown) through a wideband transformer 201, which includes a transformer 204 and a load 202. For example, power amplifier 200 amplifies a signal from an input circuit 210 for wireless transmission through a wideband wireless transmitter. However, power amplifier 200 may be part of other systems.

Power amplifier 200 includes an amplifier circuit 206 and a feedback circuit 208. A feedback loop is formed from an output of amplifier circuit 206, through feedback circuit 208, and into an input of amplifier circuit 206. The total phase shift of the feedback loop should be less than a threshold, such as 180°. The threshold may be determined where a phase shift above the threshold may cause power amplifier 200 to become unstable. For example, the output of power amplifier 200 may oscillate if the phase shift is greater than 180°. Also, feedback circuit 208 should not create a pole within a bandwidth range, such as the working bandwidth of the transmitter. A pole within the working bandwidth might change the gain characteristics of power amplifier 200.

A feedback factor β is analyzed to determine if a pole is created or an undesirable amount of phase shift is caused. The feedback factor β is defined as:

$$\beta = \frac{Z\_input}{Z\_input + Z\_feedback},$$

where Z_input is the input impedance looking into an input node between amplifier circuit 206 and input circuit 210 and Z_feedback is the feedback impedance of feedback circuit 208. As will be described in more detail below, in particular embodiments, the impedance Z_feedback has the same impedance characteristic as the impedance Z_input. For example, the impedance Z_feedback is equivalent to a capacitance and the impedance Z_input is equivalent to a capacitance. By having the same impedance characteristic, a pole may not be created by the feedback loop. Also, the phase shift caused by the feedback loop is less than the threshold in which power amplifier 100 may become unstable. For example, the phase shift (or no phase shift) caused by feedback circuit 208 when combined with the phase shift of amplifier circuit 206 is less than a threshold of, e.g., 180 degrees.

Figure 2B:
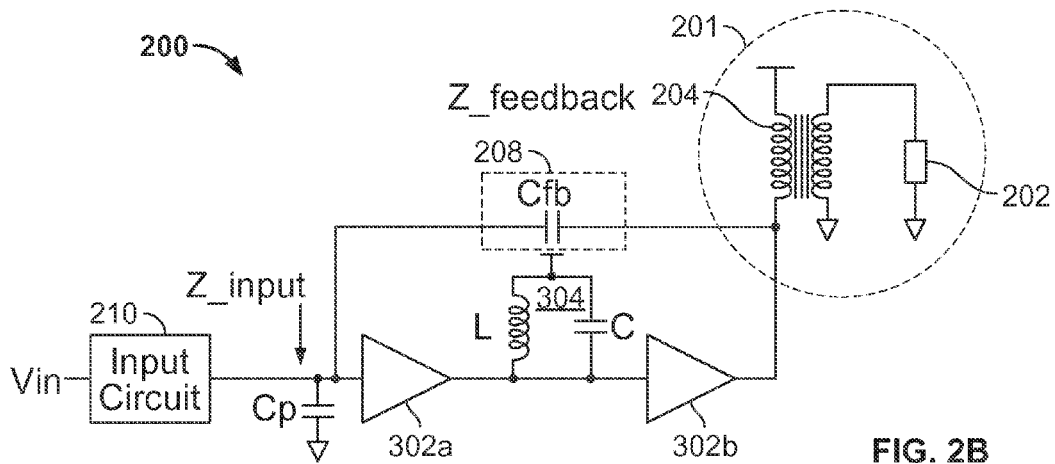
FIG. 2B shows a more detailed example of the power amplifier according to one embodiment.

FIG. 2B depicts a more detailed example of power amplifier 200 according to one embodiment. Amplifier circuit 206 includes a first amplifier 302a, a resonant tank circuit 304 and a second amplifier 302b. Resonant tank circuit 304 includes an inductor L1 and a capacitor C1. Other examples of resonant tanks may also be used. Transformer 204 and load 202 are also included in wideband transformer 201. Feedback circuit 208 includes a capacitor Cfb. A parasitic capacitance of first amplifier 302a is modeled by a capacitor Cp.

First amplifier 302a and resonant tank circuit 304 may have a high quality factor (Q). For example, the quality factor may be greater than 10. Second amplifier 302b and transformer 204 may have a low quality factor. For example, the quality factor of amplifier 302b and transformer 204 is lower than the quality factor of amplifier 302a and resonant tank circuit 304. The lower Q of amplifier 302b and transformer 204 allows power amplifier 200 to have a higher loop gain while the loop is still stable. Also, the higher the Q of amplifier 302a means the higher loop gain can be achieved while still having the loop be stable. Also, in one embodiment, it is desirable to have a low impedance coupled to transformer 204 and the antenna. Amplifier 302b provides the low impedance in part because of the low quality factor.

Amplifier 302a and resonant tank circuit 304 provide a dominant pole in the frequency response of power amplifier 200. Amplifier 302b and transformer 204 provide another pole that is less dominant. When described herein, amplifier 302a may be described as introducing the dominant pole and amplifier 302b as introducing another pole. It will be understood that the poles may be introduced by a combination of amplifier 302a with resonant tank circuit 304 or amplifier 302b with an inductor of transformer 204. Other combinations may also be used to amplify the signal.

Amplifier 302a also introduces a larger phase shift than introduced by amplifier 302b. For example, the phase shift of amplifier 302a may be around 90°. The second pole introduced by amplifier 302b might not be dominant. Due to a frequency response that is not as sharp, the phase shift introduced by amplifier 302b may be around 30°.

In one embodiment, the total phase shift of power amplifier 200 should be less than a threshold to have a stable amplifier with the gain desired. For example, a total phase shift may be less than 180°. Thus, the feedback circuit 208 should cause less than a 60° phase shift if the phase shift for amplifier 302a is 90° and the phase shift for amplifier 302b is 30°.

The phase shift of feedback circuit 208 may be determined based on the feedback factor, β. The feedback factor β may be as follows:

$$\beta = \frac{\frac{1}{j\omega * Cp}}{\frac{1}{j\omega * Cp} + \frac{1}{j\omega * Cfb}} = \frac{Cfb}{Cfb + Cp}.$$

The feedback factor does not cause any phase shift in the signal. This is because the impedances Z_feedback and Z_input have the same impedance characteristics, and a resistor-capacitor circuit is not being introduced in feedback circuit 208. Rather, the impedance characteristic of feedback circuit 208 is capacitor Cfb and the impedance characteristic of Z_input is capacitor Cp. This does not introduce a pole and a phase shift by the feedback factor.

The closed loop gain may be different based on input circuit 210. The following will describe different input circuits 210.

Figures 3A, 3B:
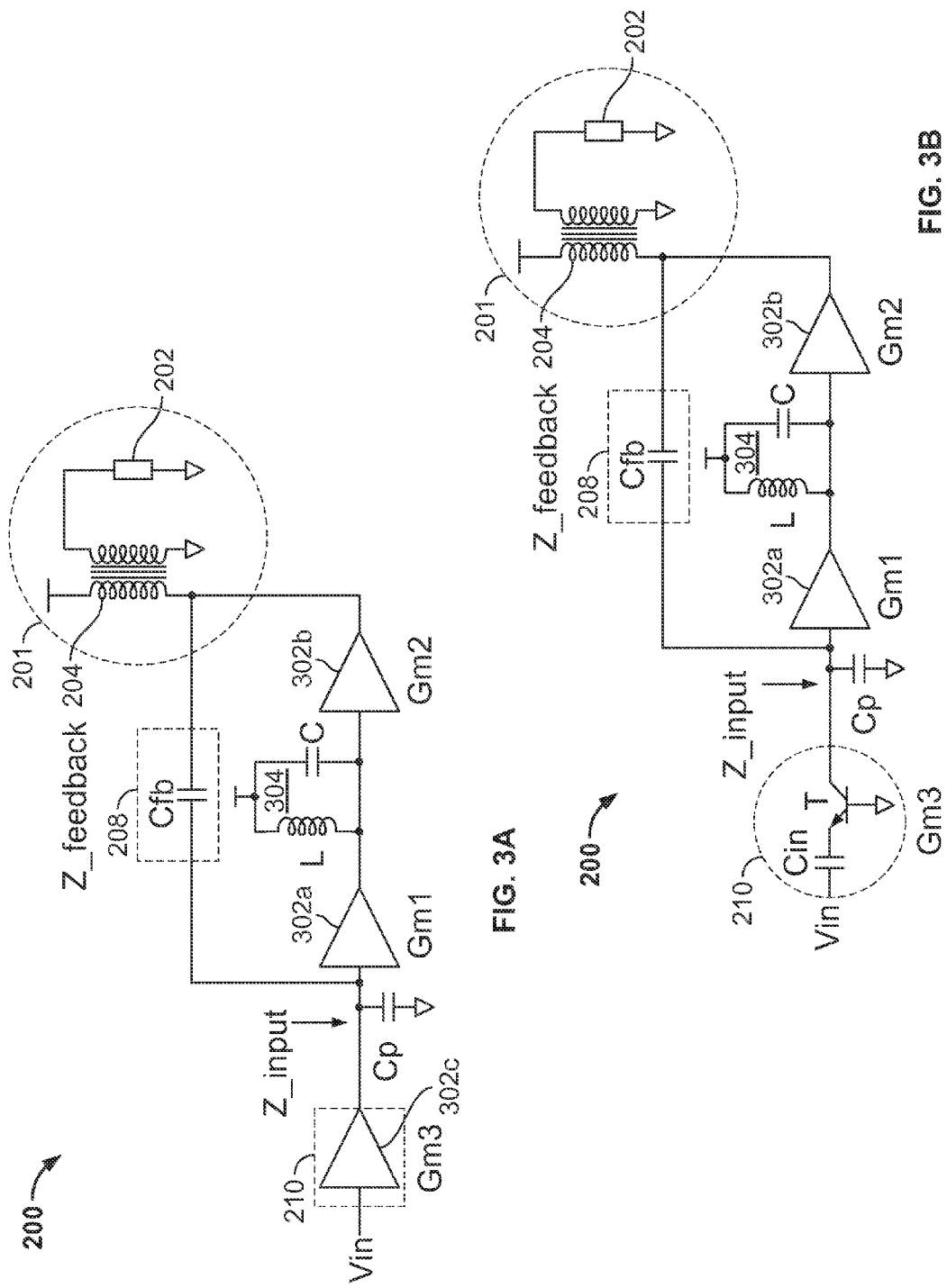
FIG. 3A shows an example of a power amplifier with a current input driver according to one embodiment.
FIG. 3B shows a more detailed example of the current input driver shown in FIG. 3A according to one embodiment.

FIG. 3A depicts an example of power amplifier 200 with a current input driver according to one embodiment. Input circuit 210 includes a third amplifier 302c. In one embodiment, a third amplifier 302c includes a transductance of Gm3. First amplifier 302a includes a transductance of Gm1 and second amplifier 302b includes a transductance of Gm2. Amplifiers 302a-302c may be transductance amplifiers (Gm amplifiers) that output a current proportional to the input voltage. The loop gain of power amplifier 200 is:

Loop_Gain=$A(j\omega)*\beta$.

The feedback factor is:

$$\beta = \frac{Cfb}{Cfb + Cp}.$$

As discussed above, the feedback factor $\beta$ does not introduce a phase shift or pole. The closed loop gain may be as follows:

$$ClosedLoopGain = \frac{Gm3}{j\omega * Cfb}.$$

FIG. 3B shows a more detailed example of the current input driver shown in FIG. 3A according to one embodiment. As shown, input circuit 210 includes a capacitor Cin and a transistor T. In one example, transistor T is a bipolar junction transistor (BJT) but other types of transistors may be used.

The dosed loop gain is a function of the transductance Gm3 of transistor T and frequency. Particular embodiments make Gm3 be a function of the capacitance Cin. For example, Gm3 may be Vin/(impedance of Cin). In this case, the closed loop gain may be equal to:

$$ClosedLoopGain = \frac{Cin}{Cfb}.$$

In the above cases, when the capacitance of capacitor Cp changes, the closed loop gain may be affected. A voltage input driver may be used to maximize loop gain.

FIG. 4 depicts an example of power amplifier 200 using a voltage input driver according to one embodiment. Input circuit 210 may include a capacitor Cin. In this case, Cp is kept sufficiently small such that capacitor Cin is greater than capacitor Cp (e.g., Cin>>Cp). In this case, the feedback factor $\beta$ is maximized and a higher loop gain is achieved for the closed loop gain.

The loop gain is:

Loop_Gain=$A(j\omega)*\beta$.

The feedback factor is:

$$\beta = \frac{Cfb}{Cfb + Cp + Cin}.$$

With Cin>>Cp, the closed loop gain may be as follows:

$$ClosedLoopGain = \frac{Cin}{Cfb}.$$

Also, in this case, feedback factor $\beta$ also does not introduce a phase shift or pole.

FIG. 5 shows an additional example of power amplifier 200 using an inductor-capacitor-resistor circuit arranged in series according to one embodiment. As shown, feedback circuit 208 includes an inductor L2, a capacitor Cfb, and a resistor R2 in a series arrangement. Input circuit 210 includes a resistor R1, inductor L1, and capacitor Cin in a series arrangement.

The loop gain is:

Loop_Gain=$A(j\omega)*\beta$.

The feedback factor is:

$$\beta = \frac{R1}{R1 + R2}.$$

The closed loop gain may be as follows:

$$ClosedLoopGain = \frac{R2}{R1}.$$

The dosed loop gain is a factor of resistors R2 and R1. This is because the feedback factor $\beta$ is not a function of frequency since inductor L and capacitor C cancel each other out if Cp is small. Thus, a closed loop gain is a function of the ratio of resistor R2 to resistor R1. The feedback factor also does not introduce a phase shift or pole.

The linear performance of power amplifier 200 may be about a 27 dB gain using conventional power amplifiers. Particular embodiments may provide a loop gain of 30 dB for a 3 dB improvement due to feedback circuit 208 not adding a pole in the frequency response. The gain is also more linear as changes in gain result in more linear performance changes.

In one example, the following may be used to determine Gm1 and Gm2 for a highest loop gain. Quality factor Q1 is a quality factor of amplifier 302a and resonant tank circuit 304. Quality factor Q2 is a quality factor for amplifier 302b and transformer 204. For amplifier 302a, when the phase shift is the only function of resonant tank circuit 304 Q1, and resonant tank circuit 304 impedance is a function of L when quality factor Q1 is fixed. For amplifier 302b, the phase shift is a function of quality factor Q2 of transformer 204 and the impedance is a function of the resistance seen by transformer 204.

Thus, for power amplifier 200 with 60 decibel phase margin, the following is found:

$Gm1*Z1(j\omega,Q1,L)*Gm2*Z2(j\omega,Q2,6\Omega)*\beta*\alpha=1$

PhaseZ1$(jf,Q1)$+phaseZ2$(j\omega,Q2)$=120 dec where Z1 is the impedance of resonant tank 302 and Z2 is the impedance of transformer 204, $\alpha$ is also a variable based a capacitance of resonant tank 302. Also known is:

$$\frac{1}{Gm1*Z1(2\text{ GHz})*\alpha*Gm2*\beta} << 6.25 \text{ }\Omega$$

This means that the impedance of amplifier 200 is less than 6.25Ω. The highest loop gain for 60 phase margin is:

LoopGain=$Gm1*Z1(2\text{GHz},Q1,L)*Gm2*Z2(6.25\Omega)$
  $*\beta*\alpha$

The Gm1 and Gm2 are chosen based on the above equation. For a certain phase margin, highest loop gain is a function of Q1.

Figure 6:
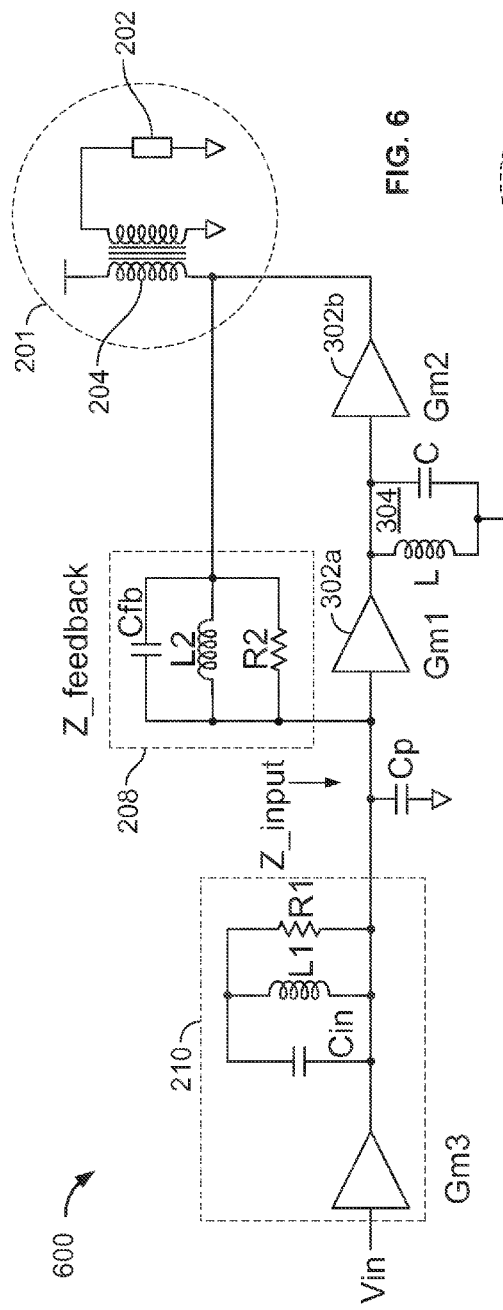
FIG. 6 shows an example of a power amplifier using an inductor-capacitor-resistor circuit arranged in parallel according to one embodiment.

FIG. 6 shows an additional example of a power amplifier 600 using an inductor-capacitor-resistor circuit arranged in parallel according to one embodiment. As shown, feedback circuit 208 includes an inductor L2, a capacitor Cfb, and a resistor R2 in a parallel arrangement. Input circuit 210 also includes a resistor R1, inductor L1, and capacitor Cin in a parallel arrangement. Arranging the inductor L1, capacitor Cin, and resistor R1 in parallel may reduce the load on a driver circuit, such as current driver Gm3, and provide improved performance for radio-frequency implementation. As in FIGS. 1-5, a feedback factor may be computed for FIG. 6. The feedback factor may be used to select components for feedback circuit 208 and input circuit 210 such that the feedback circuit 208 and input circuit 210 have the same impedance characteristic. Any components of feedback circuit 208 and input circuit 210 may be selected such that an impedance characteristic of the feedback circuit is the same as an impedance characteristic of the input circuit. For example, the feedback circuit and input circuit may include a capacitor.

Figure 7:
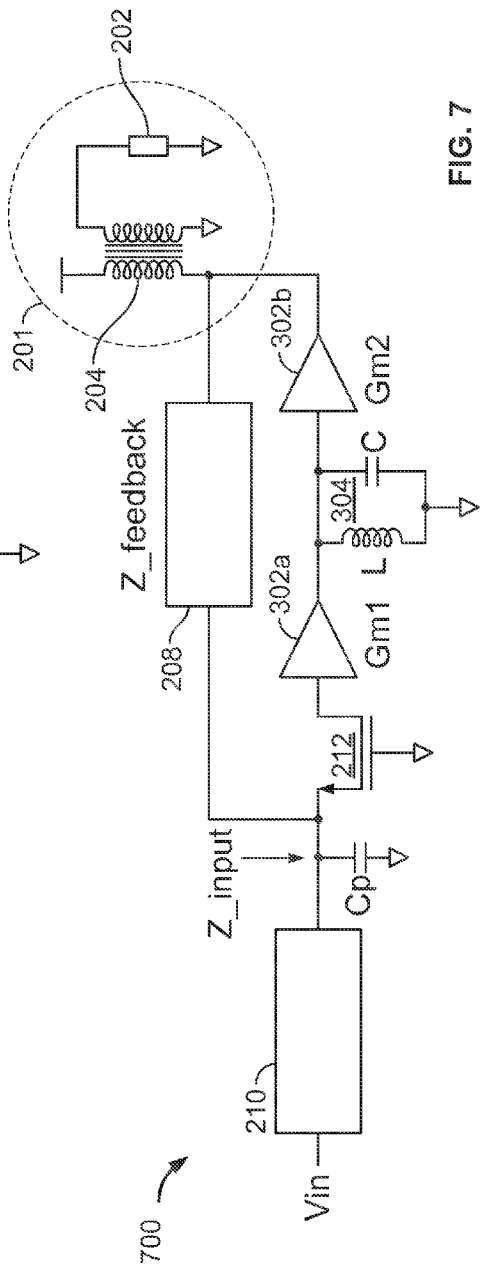
FIG. 7 shows an example of a power amplifier using a common gate within a feedback loop according to one embodiment.

FIG. 7 shows an example of a power amplifier 700 which includes an input circuit 210, a feedback circuit 208, an amplifier circuit 206, a wideband transformer 201, and a common gate 212 which may be part of amplifier circuit 206 or separately coupled to amplifier circuit 206. Amplifier circuit 206 may include the common gate 212, first amplifier stage 302a having a transductance Gm1, a resonant tank circuit 304, and a second amplifier stage 302b having a transductance Gm2. The wideband transformer 201 may drive an antenna and includes a transformer 204 and a load 202. The common gate 212 may be located within the feedback loop to extend the bandwidth of a signal. The common gate 212 may have a low impedance and therefore may not affect the impedance characteristic of a circuit. The common gate 212 may also be used as a current buffer between any of the amplifier stages. As discussed in relation to FIG. 6, components for input circuit 210 and feedback circuit 208 may be selected based on a feedback factor computed for the power amplifier circuit (e.g., 600, 700). These components may be selected in any way such that the feedback factor indicates that input circuit 210 and feedback circuit 208 have the same impedance characteristic.

FIG. 8 shows an example of a power amplifier 800 which includes multiple feedback circuits. Power amplifier 800 includes an input circuit 210, a first feedback circuit 208, a second feedback circuit 214, a first amplifier stage 302a having an inductance Gm1, a second amplifier stage 302b having an inductance Gm2, and a wideband transformer 201. First amplifier stage 302a may be connected to second amplifier stage 302b. Power amplifier 800 may also include a common gate 212. In one embodiment, first feedback circuit 208 may be connected to an amplifier circuit comprising second feedback circuit 214, first amplifier state 302a, and second amplifier stage 302b, as coupled in FIG. 8. First feedback circuit 208 has a feedback impedance of Z_feedback_1, and second feedback circuit 214 has a feedback impedance of Z_feedback_2. Multiple feedback circuits may conserve physical space in the power amplifier design. For example, multiple feedback circuits may be included to replace a resonant tank circuit in the amplifier circuit. Furthermore, the addition of another feedback circuit may extend the bandwidth and increase the gain of a signal. However, additional feedback circuits may decrease stability of a circuit and/or increase phase shift of the signal. Feedback circuits may be connected to different locations along the amplifier stages 302a-c and common gate. For example, first feedback circuit 208 may be connected from an output of the second amplifier stage 302b to the input of the common gate 212. As discussed in relation to FIGS. 6 and 7, components for input circuit 210 and feedback circuits 208, 214 are selected based on a feedback factor computed for the power amplifier circuit (e.g., 600, 700, 800). These components may be selected in any way such that feedback factor indicates that input circuit 210 and first feedback circuit 208 have the same impedance characteristic.

FIG. 9 shows an example of a power amplifier 900 similar to power amplifier 800 shown in FIG. 8. Power amplifier 900 may include a third feedback circuit 216, in addition to functionalities and features of power amplifier 800. Power amplifier 900 includes an input circuit 210, a common gate 212, a first amplifier stage 302a, a second amplifier stage 302b, a third amplifier stage 302c, first feedback circuit 208, second feedback circuit 214, and third feedback circuit 216. First feedback circuit 208 has a feedback impedance of Z_feedback_1. Second feedback circuit 214 has a feedback impedance of Z_feedback_2. Feedback circuit 216 has a feedback impedance of Z_feedback_3. The addition of third feedback circuit 216 to power amplifier 800 shown in FIG. 9 may serve to further extend the bandwidth and increase the gain of a signal. Feedback circuits may be connected to different locations along the amplifier stages 302a-c and common gate. For example, first feedback circuit 208 may be connected from the output of third amplifier stage 302c to the input of the common gate 212. First feedback circuit 208 may be connected to an amplifier circuit comprising second feedback circuit 214, third feedback circuit 216, first amplifier stage 302a, second amplifier stage 302b, and third amplifier stage 302d, as coupled in FIG. 9. Second feedback circuit 214 may be connected from the output of the first amplifier stage 302a to the input of the first amplifier stage 302a. Third feedback circuit 216 may be connected from the output of the second amplifier stage 302b to the input of the first amplifier stage 302a.

Figure 10:
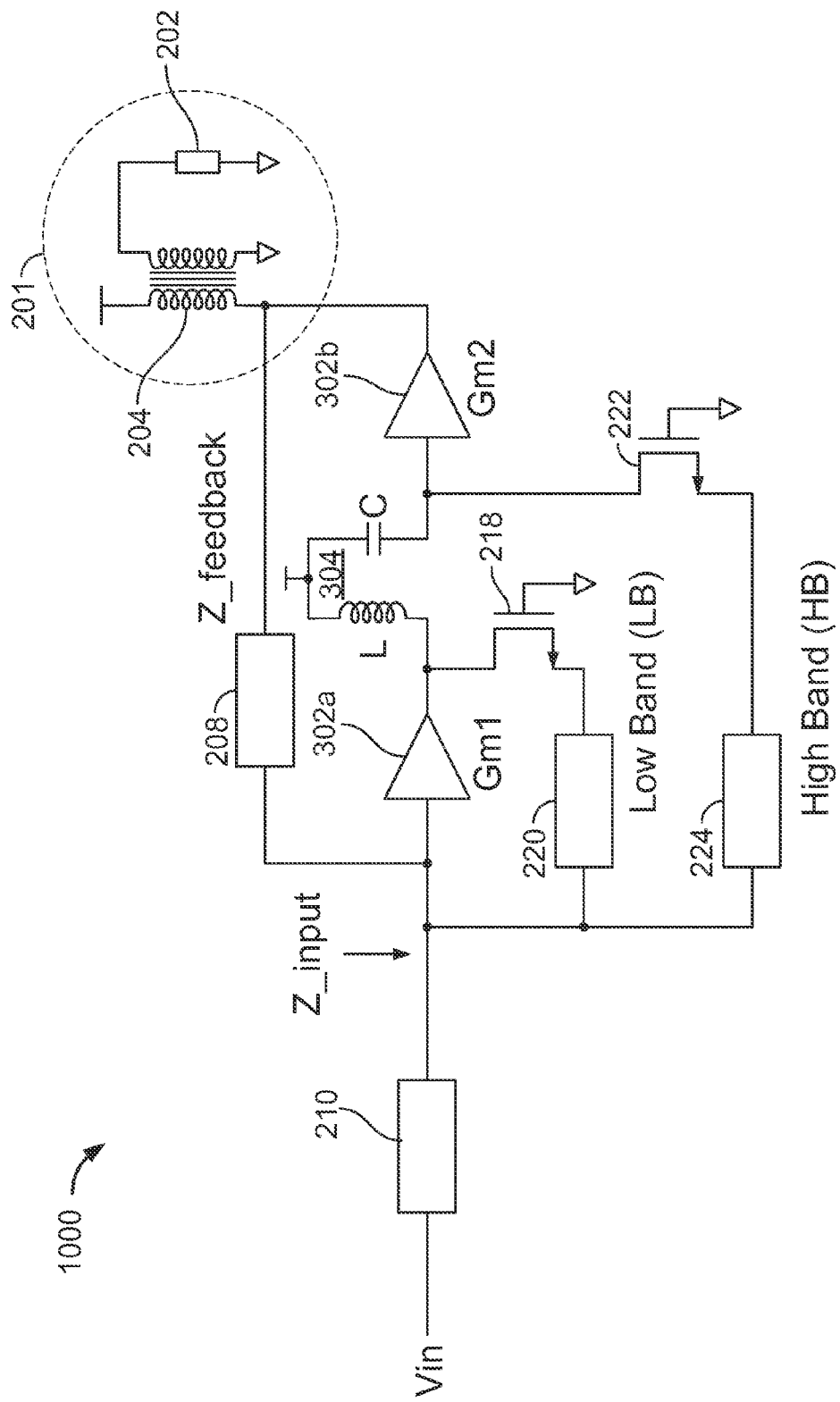
FIG. 10 shows an example of a power amplifier using a feedback circuit and multiple feedforward circuits according to one embodiment.

To address reduced stability caused by additional feedback circuits, one or more feedforward circuits may be added to the power amplifier. FIG. 10 shows an example of a power amplifier 1000 which includes a feedback circuit 208 and feedforward circuits 220, 224. In particular, power amplifier 1000 includes an input circuit 210 having input impedance Z_input, a first amplifier stage 302a having a transductance Gm1, a resonant tank circuit 304, a second amplifier stage 302b having a transductance Gm2, a feedback circuit 208 having a feedback impedance of Z_feedback, a first feedforward circuit 220, a second feedforward circuit 224, and a wideband transformer 201. Common gates 218, 222 may be included as part of the feedforward circuits 220, 224 or external to feedforward circuits 220, 224. Feedback circuit 208 may comprise multiple feedback circuits, similar to the circuits shown in FIG. 8 and FIG. 9. Each feedback circuit (e.g., 208 and/or feedback circuits included in 208 (not shown)) in power amplifier 1000 may have the same impedance characteristic as each feedforward circuit (e.g., 220, 224) in power amplifier 1000. Components for each of one or more feedback circuits and each of one or more feedforward circuits of power amplifier 1000 may be selected based on a feedforward factor such that the impedance characteristic of the feedback circuit and feedforward circuit(s) are the same. These components may include one or more of a capacitor, an inductor, a resistor, and any other appropriate component. In one example, components in one or more feedback circuits 208 within power amplifier 1000 may comprise a capacitor. Additionally, components in one or more feedforward circuits 220, 224 within power amplifier 1000 may also comprise a capacitor. Components of the input circuit 210, feedback circuit 208, and one or more feedforward circuits 220, 224 may be selected based on a calculated parameter. For example, the calculated parameter may be a feedback factor. The feedback factor may be calculated using the impedance characteristics of an input circuit 210, a feedback circuit 208, and/or a feedforward circuit 220, 224. For example, the feedback factor may indicate that an impedance characteristic of a feedback circuit 208 is the same as an impedance characteristic of an input circuit 210. In another example, the calculated parameter may be a feedforward factor. The feedforward factor may compute the impedance characteristics of an input circuit 210 a feedback circuit 208, and/or a feedforward circuit 220, 224. For example, the feedforward factor may indicate that an impedance characteristic of a feedforward circuit 220, 224 is the same as an impedance characteristic of an input circuit 210, which may also be the same as an impedance characteristic of feedback circuit 208.

A feedforward circuit may introduce a zero in the frequency response of the power amplifier. The introduction of a zero to the frequency response may improve the phase margin and overall stability of the amplifier. Feedforward circuits 220, 224 may be connected to different locations along the amplifier circuit. For example, feedforward circuit 220 may be connected from the input circuit to the input of resonant tank circuit 304. Feedforward circuit 224 may be connected from the input circuit 210 to the input of the second amplifier stage 302*b*.

Figure 11:
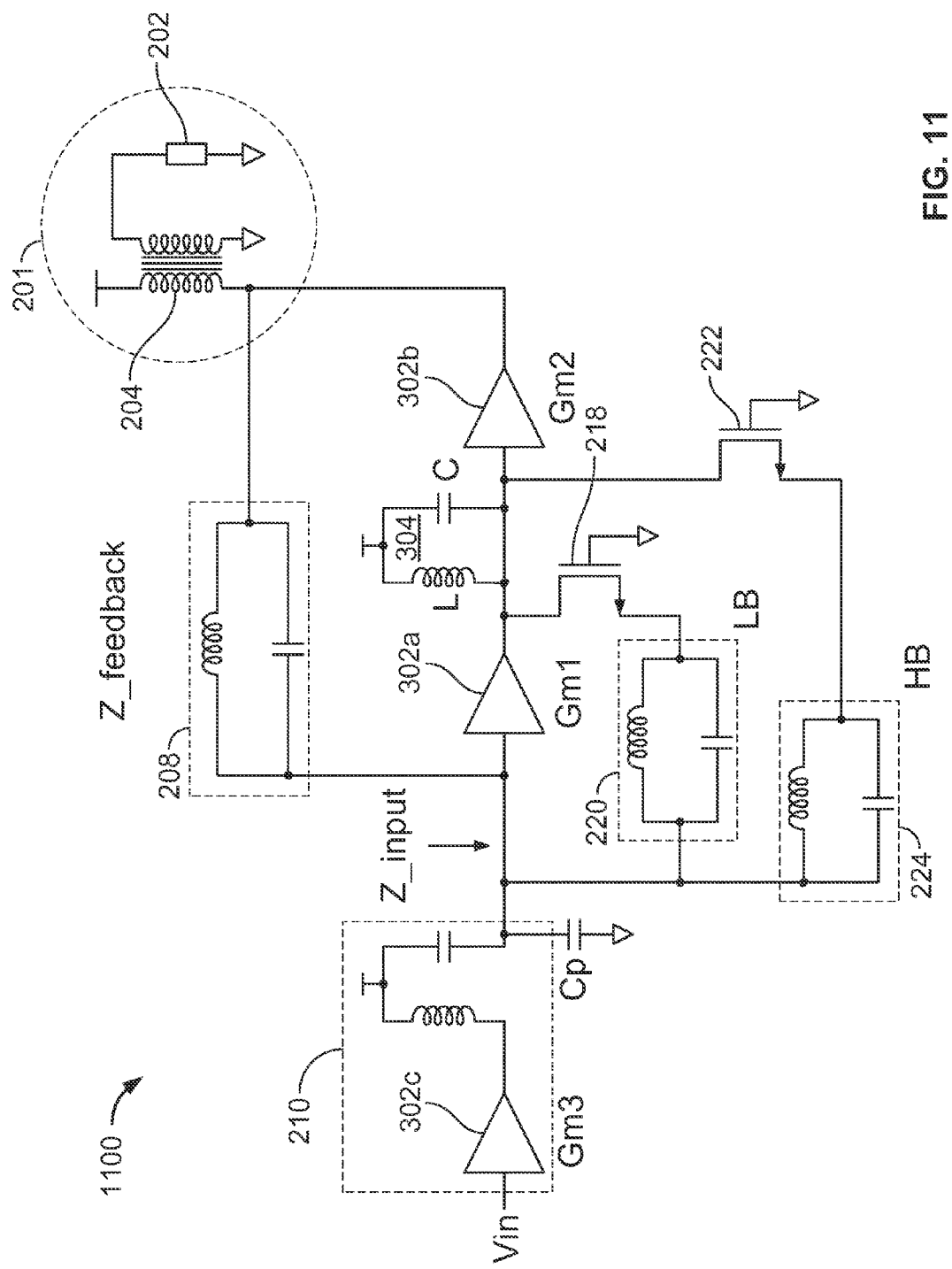
FIG. 11 shows a more detailed example of the power amplifier using a feedback circuit and multiple feedforward circuits shown in FIG. 10 according to one embodiment.

FIG. 11 shows a more detailed embodiment of a power amplifier 1100 that includes both feedback and feedforward circuits. Input circuit 210 may include current driver 302*c*, a resonant tank, or both. As discussed in relation to FIG. 10, feedback circuit 208 and feedforward circuit(s) 220, 224 may include a capacitor, resonant tank circuit, or any other appropriate component that are selected based on a calculated parameter.

Figure 12:
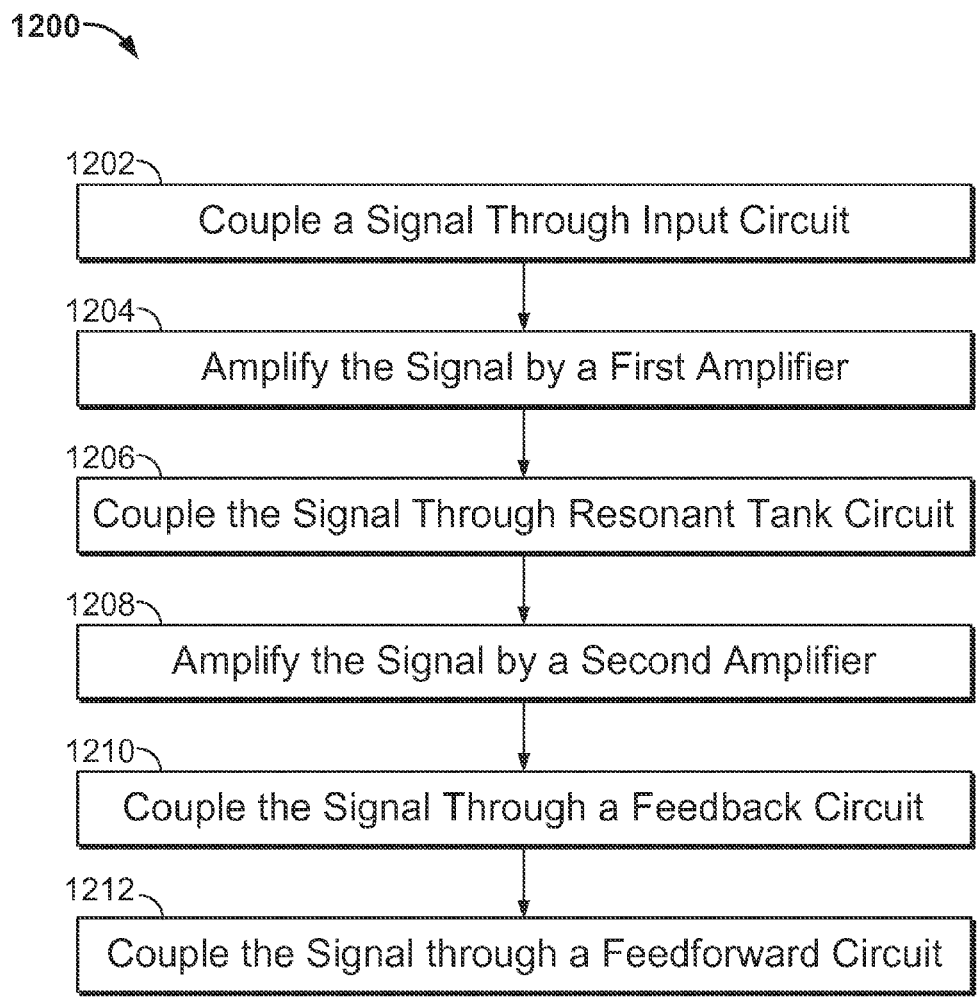
FIG. 12 depicts a simplified flowchart of a method for amplifying a signal according to one embodiment.

FIG. 12 depicts a simplified flowchart 1200 of a method for amplifying a signal according to one embodiment. At 1202, a signal is coupled through input circuit 210. At 1204, the signal is amplified by amplifier 302*a*. At 1206, the signal is coupled through resonant tank circuit 304. Amplifier 302*a* and resonant tank circuit 304 introduce a phase shift into the signal.

At 1208, the signal is amplified by amplifier 302*b*. At 1210, the signal is coupled through transformer 204 for wireless transmission. Amplifier 302*a* and transformer 204 introduce a second phase shift into the signal.

At 1210, the signal is coupled through feedback circuit 208. Feedback circuit 208 includes a capacitor and does not introduce a phase shift into the signal or introduces a phase shift where a total phase shift is less than a threshold for stable operation.

At 1212, the signal is coupled through one or more feedforward circuits 220, 224. Each feedforward circuit 220, 224 may include a capacitor and does not introduce a phase shift into the signal or introduces a phase shift where a total phase shift is less than a threshold for stable operation. Each feedforward circuit may include a resonant tank. Each feedforward circuit may include a common gate. Each feedforward circuit may include a high bandwidth circuit or a low bandwidth circuit. Components of the feedforward circuit may be selected based on a feedforward factor. An input impedance to the amplifier circuit may have a same impedance characteristic as a feedforward circuit impedance of the feedforward circuit.

Process 1200 of FIG. 12 is merely illustrative. Any steps in process 1200 may be modified (e.g., perforated in a different order), combined, or removed, and any additional steps may be added to process 1200, without departing from the scope of the present disclosure.

Accordingly, particular embodiments use a capacitor or inductor-capacitor-resistor feedback circuit. This results in a minimal phase shift in feedback circuit 208 and a power amplifier gain output that does not oscillate and is stable. The phase shift of the entire loop is less than 180°, which means power amplifier 200 is stable.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents may be employed without departing from scope of the invention as defined by the claims.

What is claimed is:

1. An apparatus comprising:
   an amplifier circuit;
   a first feedback circuit coupled to the amplifier circuit, the first feedback circuit comprising a capacitor, wherein:
   components of the first feedback circuit are selected based on a feedback factor, and
   an input impedance to the amplifier circuit has a same impedance characteristic as a feedback circuit impedance of the first feedback circuit; and
   a first feedforward circuit connected to the amplifier circuit.

2. The apparatus of claim 1, wherein the amplifier circuit comprises a common gate.

3. The apparatus of claim 1, further comprising a second feedback circuit connected to the amplifier circuit.

4. The apparatus of claim 3, wherein the second feedback circuit comprises a capacitor.

5. The apparatus of claim 3, wherein components of the second feedback circuit are selected based on the feedback factor.

6. The apparatus of claim 3, wherein an input impedance to the amplifier circuit has a same impedance characteristic as a feedback circuit impedance of the second feedback circuit.

7. The apparatus of claim 1, wherein the first feedforward circuit comprises a capacitor.

8. The apparatus of claim 1, wherein the first feedforward circuit is a low bandwidth circuit or a high bandwidth circuit.

9. The apparatus of claim 1, wherein components of the first feedforward circuit are selected based on a feedforward factor.

10. The apparatus of claim 9, wherein an input impedance to the amplifier circuit has a same impedance characteristic as a feedforward circuit impedance of the first feedforward circuit.

11. The apparatus of claim 1, further comprising a second feedforward circuit coupled to the amplifier circuit at a second location.

12. The apparatus of claim 11, wherein the second feedforward circuit comprises a capacitor.

13. The apparatus of claim 11, wherein the second feedforward circuit comprises a common gate.

14. The apparatus of claim 11, wherein the second feedforward circuit comprises a resonant tank circuit.

15. An amplifier circuit system comprising:
  a first amplifier stage configured to amplify a signal;
  a circuit configured to receive a signal from the first amplifier stage;
  a second amplifier stage configured to amplify the signal from the circuit;
  a feedback circuit coupled to the second amplifier stage, the feedback circuit comprising a capacitor, wherein:
    components of the feedback circuit are selected based on a feedback factor, and
    an input impedance to the first amplifier stage has a same impedance characteristic as a feedback circuit impedance of the feedback circuit; and
  a transformer configured to receive the signal from the second amplifier stage.

16. The system of claim 15, further comprising a feedforward circuit coupled to the amplifier circuit.

17. The system of claim 16, wherein components of the feedforward circuit are selected based on a feedforward factor.

18. The system of claim 17, wherein the input impedance to the first amplifier stage has a same impedance characteristic as a feedforward circuit impedance of the feedforward circuit.

19. The system of claim 15, wherein the feedforward circuit comprises a capacitor.

20. A method comprising:
  amplifying a signal through an amplifier circuit; coupling the signal through a feedback circuit, wherein:
    components of the feedback circuit are selected based on a feedback factor,
    an input impedance to the amplifier circuit has a same impedance characteristic as a feedback circuit impedance of the feedback circuit, and the feedback circuit comprises a capacitor; and
  coupling the signal through a feedforward circuit.

21. The method of claim 20, wherein components of the feedforward circuit are selected based on a feedforward factor.

22. The method of claim 21, wherein the input impedance to the amplifier circuit has a same impedance characteristic as a feedforward circuit impedance of the feedforward circuit.

* * * * *